United States Patent
Das et al.

(10) Patent No.: US 7,727,904 B2
(45) Date of Patent: Jun. 1, 2010

(54) METHODS OF FORMING SIC MOSFETS WITH HIGH INVERSION LAYER MOBILITY

(75) Inventors: Mrinal K. Das, Durham, NC (US); Brett Hull, Raleigh, NC (US); Sumi Krishnaswami, Morrisville, NC (US)

(73) Assignee: Cree, Inc., Durham, NC (US)

( * ) Notice: Subject to any disclaimer, the term of this patent is extended or adjusted under 35 U.S.C. 154(b) by 576 days.

(21) Appl. No.: 11/486,752

(22) Filed: Jul. 14, 2006

(65) Prior Publication Data

US 2008/0233285 A1    Sep. 25, 2008

Related U.S. Application Data

(60) Provisional application No. 60/717,953, filed on Sep. 16, 2005.

(51) Int. Cl.
*H01L 21/31*   (2006.01)
*H01L 21/469*  (2006.01)

(52) U.S. Cl. ............... 438/770; 438/212; 438/765; 257/E21.055

(58) Field of Classification Search ........... 438/758, 438/762, 765, 199, 212, 770
See application file for complete search history.

(56) References Cited

U.S. PATENT DOCUMENTS

| | | | |
|---|---|---|---|
| 3,924,024 A | 12/1975 | Naber et al. | |
| 4,069,058 A | 1/1978 | Washburn | |
| 4,466,172 A | 8/1984 | Batra | |
| 4,875,083 A | 10/1989 | Palmour | |
| 5,030,600 A | 7/1991 | Hida et al. | |
| 5,114,887 A | 5/1992 | Sekine et al. | |
| 5,170,231 A | 12/1992 | Fujii et al. | |
| 5,170,455 A | 12/1992 | Goossen et al. | |
| 5,184,199 A | 2/1993 | Fujii et al. | |
| 5,479,316 A | 12/1995 | Smrtic et al. | |
| 5,506,421 A | 4/1996 | Palmour et al. | |
| 5,510,630 A | 4/1996 | Agarwal | |

(Continued)

FOREIGN PATENT DOCUMENTS

CN    1478302 A    2/2004

(Continued)

OTHER PUBLICATIONS

Chung et al. "Improved Inversion Channel Mobility for 4H-SiC MOSFETs Following High Temperature Anneals in Nitric Oxide" *IEEE Electron Device Letters* 22(4)176-178 (2001).

(Continued)

*Primary Examiner*—Alexander G Ghyka
(74) *Attorney, Agent, or Firm*—Myers Bigel Sibley & Sajovec (57) ABSTRACT

Methods of forming an oxide layer on silicon carbide include thermally growing an oxide layer on a layer of silicon carbide, and annealing the oxide layer in an environment containing NO at a temperature greater than 1175° C. The oxide layer may be annealed in NO in a silicon carbide tube that may be coated with silicon carbide. To form the oxide layer, a preliminary oxide layer may be thermally grown on a silicon carbide layer in dry $O_2$, and the preliminary oxide layer may be re-oxidized in wet $O_2$.

14 Claims, 5 Drawing Sheets

U.S. PATENT DOCUMENTS

| | | | |
|---|---|---|---|
| 5,554,204 A | 9/1996 | Kotaka et al. | |
| 5,587,870 A | 12/1996 | Anderson et al. | |
| 5,726,463 A | 3/1998 | Brown et al. | |
| 5,739,564 A | 4/1998 | Kosa et al. | |
| 5,763,905 A | 6/1998 | Harris | |
| 5,837,572 A | 11/1998 | Gardner et al. | |
| 5,877,045 A | 3/1999 | Kapoor | |
| 5,885,870 A | 3/1999 | Maiti et al. | |
| 5,939,763 A | 8/1999 | Hao et al. | |
| 5,960,289 A | 9/1999 | Tsui et al. | |
| 5,972,801 A * | 10/1999 | Lipkin et al. | 438/770 |
| 6,025,608 A | 2/2000 | Harris et al. | |
| 6,028,012 A | 2/2000 | Wang | |
| 6,048,766 A | 4/2000 | Gardner et al. | |
| 6,054,352 A | 4/2000 | Ueno | |
| 6,063,698 A | 5/2000 | Tseng et al. | |
| 6,096,607 A | 8/2000 | Ueno | |
| 6,100,169 A | 8/2000 | Suvorov et al. | |
| 6,107,142 A | 8/2000 | Suvorov et al. | |
| 6,117,735 A | 9/2000 | Ueno | |
| 6,136,728 A | 10/2000 | Wang | |
| 6,165,822 A | 12/2000 | Okuno et al. | |
| 6,171,905 B1 | 1/2001 | Morita et al. | |
| 6,190,973 B1 | 2/2001 | Berg et al. | |
| 6,204,203 B1 | 3/2001 | Narwanker et al. | |
| 6,211,035 B1 | 4/2001 | Moise et al. | |
| 6,221,700 B1 | 4/2001 | Okuno et al. | |
| 6,228,720 B1 | 5/2001 | Kitabatake et al. | |
| 6,238,967 B1 | 5/2001 | Shiho et al. | |
| 6,239,463 B1 | 5/2001 | Williams et al. | |
| 6,246,076 B1 | 6/2001 | Lipkin et al. | |
| 6,261,976 B1 | 7/2001 | Dong | |
| 6,297,172 B1 | 10/2001 | Kashiwagi | |
| 6,316,791 B1 | 11/2001 | Schorner et al. | |
| 6,342,748 B1 | 1/2002 | Nakamura et al. | |
| 6,344,663 B1 | 2/2002 | Slater, Jr. et al. | |
| 6,444,542 B2 | 9/2002 | Moise et al. | |
| 6,455,892 B1 | 9/2002 | Okuno et al. | |
| 6,524,877 B1 | 2/2003 | Nakazawa et al. | |
| 6,559,068 B2 | 5/2003 | Alok et al. | |
| 6,593,620 B1 | 7/2003 | Hshieh et al. | |
| 6,600,138 B2 | 7/2003 | Hauf et al. | |
| 6,610,366 B2 | 8/2003 | Lipkin | |
| 6,632,747 B2 | 10/2003 | Niimi et al. | |
| 6,707,011 B2 | 3/2004 | Tay et al. | |
| 6,767,843 B2 | 7/2004 | Lipkin et al. | |
| 7,022,378 B2 | 4/2006 | Das et al. | |
| 7,067,176 B2 | 6/2006 | Das et al. | |
| 2002/0102358 A1 | 8/2002 | Das et al. | |
| 2002/0172774 A1* | 11/2002 | Lipkin | 427/376.2 |
| 2003/0143863 A1* | 7/2003 | Chen et al. | 438/765 |
| 2004/0219800 A1* | 11/2004 | Tognetti | 438/765 |
| 2006/0030163 A1* | 2/2006 | Vaartstra | 438/765 |

FOREIGN PATENT DOCUMENTS

| | | |
|---|---|---|
| CN | 1531744 A | 9/2004 |
| CN | 1606140 A | 4/2005 |
| DE | 198 09 554 | 9/1998 |
| DE | 19900171 | 12/2000 |
| DE | 10036208 | 2/2002 |
| EP | 0 637 069 A1 | 2/1995 |
| EP | 0 637 069 B1 | 1/2001 |
| EP | 1 523 032 A2 | 4/2005 |
| JP | 64-008633 | 1/1989 |
| JP | 03-157974 | 7/1991 |
| JP | 06-232402 | 8/1994 |
| JP | 7-221038 A | 8/1995 |
| JP | 07221038 A | 8/1995 |
| JP | 08-264766 | 10/1996 |
| JP | 09-205202 | 8/1997 |
| JP | 11-191559 | 7/1999 |
| JP | 11-238742 | 8/1999 |
| JP | 11-261061 | 9/1999 |
| JP | 11-266017 | 9/1999 |
| JP | 11-274487 | 10/1999 |
| JP | 2000-049167 | 2/2000 |
| JP | 2000-082812 | 3/2000 |
| JP | 2000-252461 A | 9/2000 |
| JP | 2001-060067 | 3/2001 |
| JP | 2000-106371 | 4/2001 |
| WO | WO 97/17730 | 5/1997 |
| WO | WO 97/39485 | 10/1997 |
| WO | WO 98/02924 | 1/1998 |
| WO | WO 99/63591 | 12/1999 |
| WO | WO 00/13236 | 3/2000 |
| WO | WO 03/003435 A2 | 1/2003 |

OTHER PUBLICATIONS

International Search Report and Written Opinion for PCT/US2006/035285; date of mailing Jan. 22, 2007.

Matin et al. "A Self-Aligned Process for High-Voltage, Short-Channel Vertical DMOSFETs in 4H-SiC" *IEEE Transactions on Electron Devices* 51(10):1721-1725 (2004).

McDonald et al. "Comparison of nitrogen incorporation in SiO2/SiC and $SiO_2$/Si structures" *Applied Physics Letters* 76(5):568-570 (2000).

Ryu et al. "Design and Process Issues for Silicon Carbide Power DiMOSFETS" *Mat. Res. Soc. Symp. 640*:H4.5.1-H4.5.6 (2001).

Yano et al. "High Temperature NO Annealing of Deposited $SiO_2$ and SiON Films on N-type 4H-SiC" *Materials Science Forum 483-485*:685-688 (2005).

Bhatnagar et al. "Comparison of 6H-SiC, 3C-SiC, and Si for Power Devices" *IEE Transactions on Electron Devices*, vol. 40(3), Mar. 1993.

Chung et al. "Improved Inversion Channel Mobility for 4H-SiC MOSFETs Following High Temperature Anneals in Nitric Oxide" *IEEE Electron Device Letters* vol. 22(4), Apr. 2001.

Chung, G.Y. et al, "Improved Inversion Channel Mobility for 4H-SiC MOSFETs Following High Temperature Anneals in Nitric Oxide", IEEE Electron Device Letters, 22:4, pp. 176-178 (Apr. 2001).

McDonald, K. et al., "Comparison of nitrogen incorporation in $SiO_2$/SiC and $SiO_2$/Si structures", Applied Physics letters, 76:5, pp. 568-570 (Jan. 31, 2000).

A.K. Agarwal, J.B. Casady, L.B. Rowland, W.F. Valek, and C.D. Brandt, "1400 V 4H-SiC Power MOSFET's;" Materials Science Forum vols. 264-268, pp. 989-992, 1998.

A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFETs," *Materials Science Forum*, vols. 338-342, pp. 1307-1310, 2000.

A.K. Agarwal, S. Seshadri, and L. B. Rowland, "Temperature Dependence of Fowler-Nordheim Current in 6H-and 4H-SiC MOS Capacitors." *IEEE Electron Device Letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.

Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.

Agarwal et al. "Temperature Dependence of Fowler-Nordheim Current in 6H-and 4H-SiC MOS Capacitors," *IEEE Electron Device Letters*. vol. 18, No. 12, Dec. 1997, pp. 592-594.

Chakraborty et al. "Interface Properties of $N_2O$-annealed $SiO_2$/SiC system," *Proceedings IEEE Hong Kong Electron Devices Meeting*. Jun. 24, 2000, pp. 108-111.

Chang et al. "Observation of a Non-stoichiometric Layer at the Silicon Dioxide—Silicon Carbide Interface: Effect of Oxidation Temperature and Post-Oxidation Processing Conditions," *Mat. Res. Soc. Symp. Proc.* vol. 640, 2001.

Chung et al., "Effects of Anneals in Ammonia on the Interface Trap Density Near the Band Edges in 4H-Silicon Carbide Metal-Oxide-Semiconductor Capacitors", *Applied Physics Letters*, vol. 77, No. 22, Nov. 27, 2000, pp. 3601-3603.

Cho et al. "Improvement of charge trapping by hydrogen post-oxidation annealing in gate oxide of 4H-SiC methel-oxide-semiconductor capacitors," *Applied Physics Letters*. vol. 77, No. 8, pp. 1215-1217.

Chung et al. "The Effect of Si:C Source Ratio on $SiO_2$/SiC Interface State Density for Nitrogen Doped 4H and 6H-SiC," *Materials Science Forum*. (2000) vols. 338-342, pp. 1097-1100.

D. Alok, E. Arnold, and R. Egloff, "Process Dependence of Inversion Layer Mobility in 4H-SiC Devices,"99 *Materials Science Forum*, vols. 338-342, pp. 1077-1080, 2000.

Das, Mrinal K. Graduate thesis entitled, *Fundamental Studies of the Silicon Carbide MOS Structure*. Purdue University.

De Meo et al., "Thermal Oxidation of SiC in $N_2O$", *J. Electrochem. Soc.*, vol. 141, 1994, pp. L150-L152.

del Prado et al. "Full Composition Range Silicon Oxynitride Films Deposited by ECR-PECVD at Room Temperatures," *Thin Solid Films*. vol. 343-344 (1999) p. 437-440.

Dimitrijev et al., "Nitridation of Silicon-Dioxide Films Grown on 6H Silicon Carbide", *IEEE Electronic Device Letters*, vol. 18, No. 5, May 5, 1997, pp. 175-177.

Fukuda et al. "Improvement of $SiO_2$/4H-SiC Interface Using High-Temperature Hydrogen Annealing at Low Pressure and Vacuum Annealing," *Jpn J. Appl. Phys.* vol. 38, Apr. 1999, pp. 2306-2309.

Fukuda et al. "Improvement of $SiO_2$/4H-SiC Interface by Using High Temperature Hydrogen Annealing at 1000° C," *Extended Abstracts of the International Conference on Solid State Devices and Materials*, Japan Society of Applied Physics, Tokyo, Japan, Sep. 1998.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in 4H." *Applied Physics Letters*, vol. 76, No. 13, pp. 1713-1715, Mar. 2000.

G.Y. Chung, C.C. Tin, J.R. Williams, K. McDonald, R.A. Weller, S.T. Pantelides, L.C. Feldman, M.K. Das, and J.W. Palmour, "Improved Inversion Channel Mobility for 4H-SiC MOSETs Following High Temperature Anneals in Nitric Oxide," *IEE Electron Device Letters* accepted for publication.

H.F. Li, S. Dimitrijev, H.B. Harrison, D. Sweatman, and P.T. Tanner. "Improving $SiO_2$ Grown on P-Type 4H-SiC by NO Annealing." *Materials Science Forum*. vols. 264-268 (1998) pp. 869-872.

International Preliminary Examination Report issued Aug. 4, 2003 for corresponding PCT application No. PCT/US02/11691.

International Search Report for PCT/US01/30715, dated Jun. 5, 2002.

International Search Report for PCT/US02/09393, dated Oct. 15, 2003.

International Search Report for PCT/US02/11691, dated Dec. 17, 2002.

International Search Report, PCT/US 01/42414, dated Apr. 23, 2002.

J. Tan, J.A. Cooper, Jr., and Mr.R. Melloch, "High-Voltage Accumulation-Layer UMOSFETs in 4H-SiC," *IEEE Electron Device Letters*, vol. 19, No. 12, pp. 487-489, Dec. 1998.

J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

J.P. Xu, P.T. Lai, C.L. Chan, B. Li, and Y.C. Cheng, "Improved Performance and Reliability of $N_2O$-Grown Oxynitride on 6H-SiC," *IEEE Electron Device Letters*, vol. 21, No. 6, pp. 298-300, Jun. 2000.

Jamet, et al. "Physical properties of $N_2O$ and NO-nitrided gate oxides grown on 4H SiC," *Applied Physics Letters*. vol. 79, No. 3, Jul. 16, 2001, pp. 323-325.

K. Ueno and Tadaaki Oikawa, "Counter-Doped MOSFET's of 4H-SiC." *IEEE Electron Device Letters*, vol. 20, No. 12, pp. 624-626, Dec. 1999.

K. Ueno, R. Asai, and T. Tsuji. "4H-SiC MOSFET's Utilizing the $H_2$ Surface Cleaning Technique." *IEEE Electron Device Letters*, vol. 19, No. 7, Jul. 1998, pp. 244-246.

Kobayashi et al. "Dielectric Breakdown and Current Conduction of Oxide/Nitride/Oxide Multi-Layer Structures," *1990 IEEE Symposium on VLSI Technology*. pp. 119-120.

L.A. Lipkin and J.W. Palmour, "Low interface state density oxides on p-type SiC," Materials Science Forum vols. 264-268, pp. 853-856, 1998.

Lai et al. "Interface Properties of $N_2O$-Annealed $NH_3$-Treated 6H-SiC MOS Capacitor," *Electron Devices Meeting*, Jun. 26, 1999, pp. 46-49.

Leonhard et al. "Long term stability of gate-oxides on n- and p-type silicon carbide studied by charge injection techniques," *Materials Science Engineering*, vol. 46, No. 1-3, Apr. 1997, pp. 263-266.

Lipkin et al. "Insulator Investigation on SiC for Improved Reliability," *IEEE Transactions on Electron Devices*. vol. 46, No. 3, Mar. 1999, pp. 525-532.

Lipkin et al. "Challenges and State-of-the-Art Oxides in SiC," *Mat. Res. Soc. Symp. Proc.* vol. 640, Nov. 2000, pp. 27-29.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.

M.A. Capano, S.Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

Ma et al. "Fixed and trapped charges at oxide-nitride-oxide heterostructure interfaces formed by remote plasma enhanced chemical vapor deposition," *J. Vac. Sci. Technol. B*. vol. 11, No. 4, Jul./Aug. 1993, pp. 1533-1540.

Mutin, P. Herbert, "Control of the Composition and Structure of Silicon Oxycarbide and Oxynitride Glasses Derived from Polysiloxane Precursors," *Journal of Sol-Gel Science and Technology*. vol. 14 (1999) pp. 27-38.

P. J. Tobin, Y. Okada, S. A. Ajuria, V. Lakhotia, W. A Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811-1817.

P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

P.T. Lai, Supratic Chakraborty, C.L. Chan, and Y.C. Cheng, "Effects of nitridation and annealing on interface properties of thermally oxidized $SiO_2$/SiC metal-oxide-semiconductor system," *Applied Physics Letters*, vol. 76, No. 25, pp. 3744-3746, Jun. 2000.

Pantelides et al. "Atomic-Scale Engineering of the SiC-$SiO_2$ Interface," *Materials Science Forum*. (2000) vols. 338-342, pp. 1133-1136.

R. Sch rner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

R. Schorner, P. Friedrichs, D. Peters, and D. Stephani; "Significantly Improved Performance of MOSFETs on Silicon Carbide Using the 15R-SiC Polytype," *IEEE Electron Device Letters*, vol. 20, No. 5, pp. 241-244, May 1999.

Ranbir Singh, Sei-Hyung Ryu and John W. Palmour, "High Temperature, High Current; 4H-SiC Accu-DMOSFET," Materials Science Forum vols. 338-342, pp. 1271-1274, 2000.

Ryu et al., Article and Presentation: "27 $m\Omega$-$cm^2$, 1.6 kV Power DiMOSFETs in 4H-SiC;" *Proceedings of the 14 International Symposium on Power Semiconductor Devices & ICs 2002*, Jun. 4-7, 2002, Santa Fe, NM.

S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.

S. Sridevan, P.K. McLarty, and B.J. Baliga, "On the Presence of Aluminum in Thermally Grown Oxides on 6H-Silicon Carbide," *IEEE Electron Device Letters*, vol. 17, No. 3, pp. 136-138, Mar. 1996.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

Suzuki et al. "Effect of Post-oxidation-annealing in Hydrogen on $SiO_2$/4H-SiC Interface," *Materials Science Forum*, vols. 338-342 (2000) 1073-6.

Sze, S.M. *Physics of Semiconductor Devices*, John Wiley & Sons, p. 383-390.

V. R. Vathulya, H. Shang, and M. H. White, "A Novel 6H-SiC Power DMOSFET with Implanted P-Well Spacer." *IEEE Electron Device Letters*, vol. 20, No. 7, Jul. 1999, pp. 354-356.

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.

V.V. Afanas'ev, M. Bassler, G. Pensl, and M. Schulz, "Intrinsic SiC/$SiO_2$ Interface States," *Phy. Stat. Sol. (a)*, vol. 162, pp. 321-337, 1997.

Wang et al. "High Temperature Characteristics of High-Quality SiC MIS Capacitors with O/N/O Gate Dielectric," *IEEE Transactions on Electron Devices*. vol. 47, No. 2, Feb. 2000, pp. 458-462.

Wang et al. "The Effects of $NH_3$ Plasma Passivation on Polysilicon Thin-Film Transistors," *IEEE Electron Device Letters*, vol. 16, No. 11, Nov. 1995, pp. 503-505.

Williams et al., "Passivation of the 4-H SiC/$SiO_2$ Interface with Nitric Oxide", *Materials Science Forum*, vols. 389-393, 2002, pp. 967-972.

Y. Wang, C. Weitzel, and M. Bhatnagar, "Accumulation-Mode SiC Power MOSFET Design Issues," *Materials Science Forum*, vols. 338-342, pp. 1287-1290.

* cited by examiner

METHODS OF FORMING SIC MOSFETS WITH HIGH INVERSION LAYER MOBILITY

RELATED APPLICATION

This application claims the benefit of and priority to U.S. Provisional Patent Application No. 60/717,953, filed Sep. 16, 2005, the disclosure of which is hereby incorporated herein by reference as if set forth in its entirety.

STATEMENT OF GOVERNMENT INTEREST

The present invention was made, at least in part, with support from United States Air Force contract number FA8650-04-2-2410 and ARL/MTO contract number W911NF-04-2-0022. The Government has certain rights in this invention.

FIELD OF THE INVENTION

This invention relates to methods of fabricating power devices and the resulting devices, and more particularly to silicon carbide power devices and methods of fabricating silicon carbide power devices.

BACKGROUND

Power semiconductor devices are widely used to carry large currents and support high voltages. Modern power devices are generally fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, power MOSFETs may include a lateral structure or a vertical structure. In a lateral structure, the drain, gate and source terminals are on the same surface of a substrate. In contrast, in a vertical structure, the source and drain are on opposite surfaces of the substrate.

One widely used silicon power MOSFET is the double diffused MOSFET (DMOSFET) which is fabricated using a double-diffusion process. In these devices, a p-base region and an n+ source region are diffused through a common opening in a mask. The p-base region is driven in deeper than the n+ source. The difference in the lateral diffusion between the p-base and n+ source regions forms a surface channel region.

Recent development efforts in power devices have also included investigation of the use of silicon carbide (SiC) devices for power devices. Silicon carbide (SiC) has a combination of electrical and physical properties that make it attractive for a semiconductor material for high temperature, high voltage, high frequency and high power electronic devices. These properties include a 3.0 eV bandgap, a 4 MV/cm electric field breakdown, a 4.9 W/cm-K thermal conductivity, and a $2.0 \times 10^7$ cm/s electron drift velocity.

Consequently, these properties may allow silicon carbide power devices to operate at higher temperatures, higher power levels and/or with lower specific on-resistance than conventional silicon-based power devices. A theoretical analysis of the superiority of silicon carbide devices over silicon devices is found in a publication by Bhatnagar et al. entitled "Comparison of 6H—SiC, 3C—SiC and Si for Power Devices", IEEE Transactions on Electron Devices, Vol. 40, 1993, pp. 645-655. A power MOSFET fabricated in silicon carbide is described in U.S. Pat. No. 5,506,421 to Palmour entitled "Power MOSFET in Silicon Carbide" and assigned to the assignee of the present invention.

4H—SiC Power DMOSFETs have the potential to offer significant advantages over conventional high voltage Si power switches. Unfortunately, however, it may be difficult to thermally grow an acceptable gate oxide for these devices. Much effort has been focused on reducing the interface trap density ($D_{IT}$) at the SiC/SiO$_2$ interface in order to increase the channel mobility ($\mu_{CH}$) of the devices. Nitric Oxide (NO) anneals at 1175° C. have increased the $\mu_{CH}$ from single digits to ~30 cm$^2$/Vs. See, e.g., G. Y. Chung, et al., *IEEE Electron Dev. Let* 22, 176 (2001). Researchers have demonstrated even higher channel mobility (~150 cm$^2$V/s) by oxidizing in an environment containing metallic impurities. See, e.g., U.S. Pat. No. 6,559,068. However, such a process may result in significant oxide contamination, may provide an uncontrolled oxidation rate ($t_{OX}$>1500 Å), and/or may be incompatible with high temperature processing steps such as may be used for ohmic contact anneals.

SUMMARY

Methods of forming an oxide layer on silicon carbide according to some embodiments of the invention include thermally growing an oxide layer on a layer of silicon carbide, and annealing the oxide layer in an environment containing NO at a temperature greater than 1175° C.

Annealing the oxide layer may include annealing the oxide layer in an environment containing NO at a temperature between about 1200° C. and about 1600° C. In particular embodiments, annealing the oxide layer may include annealing the oxide layer in an environment containing NO at a temperature of about 1300° C. Furthermore, the oxide layer may be annealed for about 2 hours.

The methods may further include placing the oxide layer on the silicon carbide layer in a silicon carbide tube, and annealing the oxide layer may include annealing the oxide layer in the silicon carbide tube. The silicon carbide tube may include a tube of silicon carbide having a silicon carbide coating thereon. The silicon carbide coating on the silicon carbide tube may include a silicon carbide coating deposited by chemical vapor deposition on the silicon carbide tube.

Thermally growing the oxide may include thermally growing the oxide in the presence of metallic impurities. In particular, thermally growing the oxide may include thermally growing the oxide in the presence of alumina including the metallic impurities. Thermally growing the oxide layer may include thermally growing the oxide layer to a thickness of between about 500 Å and 900 Å. Thermally growing the oxide layer may include thermally growing a preliminary oxide layer on the silicon carbide layer in dry O2 at a temperature of about 1200° C., and re-oxidizing the preliminary oxide layer in wet O2 at a temperature of about 950° C.

The silicon carbide layer may include an epitaxial layer of 4H p-type silicon carbide having an off-axis orientation that may be tilted at about 8° from a (0001) plane.

Methods of forming a silicon carbide MOS structure according to some embodiments of the invention include thermally growing an oxide layer on a layer of silicon carbide, annealing the oxide layer in an environment containing NO at a temperature greater than 1175° C., and forming a gate electrode on the oxide layer.

The methods may further include forming a gate contact on the oxide layer, the gate contact including polysilicon and/or a metal.

The silicon carbide layer may include a region of p-type silicon carbide, and the methods may further include forming an n-type region in the p-type silicon carbide region. Thermally growing the oxide layer may include thermally growing the oxide layer on the p-type silicon carbide region and at least partially on the n-type region.

The p-type silicon carbide region may include a p-type epitaxial layer, and the n-type region may include an n-type source region. The methods may further include forming an n-type drain region in the p-type epitaxial layer that is spaced apart from the n-type source region and that defines a channel region between the source region and the drain region. Thermally growing the oxide layer may include thermally growing the oxide layer on the channel region.

The methods may further include forming ohmic contacts on the n-type source region and the n-type drain region, and annealing the ohmic contacts on the n-type source region and the n-type drain region at a temperature of at least about 500° C. The channel region may have a channel mobility of at least about 40 $cm^2/Vs$ at room temperature following the ohmic contact anneal.

The p-type silicon carbide region may include an implanted p-type well region, and the n-type region may include an n-type source region. The methods may further include forming the implanted p-type well region adjacent an n-type JFET region that extends from a surface of the structure to a drift region disposed beneath the p-type well region, and thermally growing the oxide layer may include thermally growing the oxide layer on a channel region extending in the p-type well region between the source region and the JFET region.

The methods may further include forming an ohmic contact on the n-type source region, and annealing the ohmic contact on the n-type source region at a temperature of at least about 500° C. The channel region may have a channel mobility of at least about 35 $cm^2/Vs$ at room temperature following the ohmic contact anneal.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

As used herein, the term "and/or" includes any and all combinations of one or more of the associated listed items. It will be understood that, although the terms first, second, third etc. may be used herein to describe various elements, components, regions, materials, layers and/or sections, these elements, components, regions, layers and/or sections should not be limited by these terms. These terms are only used to distinguish one element, component, region, layer, material or section from another element, component, region, layer, material or section. Thus, a first element, component, region, layer, material or section discussed below could be termed a second element, component, region, layer, material or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Embodiments of the invention provide DMOSFET devices formed using a thermally grown Metal Enhanced Oxidation (MEO) and/or high temperature (>1175° C.) NO annealing. Both processes may reduce $D_{IT}$ near the conduction band ($E_C$), which may enable higher inversion layer mobility on implanted and/or epitaxial channel devices. Furthermore, MEO and/or NO processes according to some embodiments of the invention may exhibit controlled oxidation rates ($t_{OX}$~600-900 Å) and/or temperature stability, which may make them suitable for 4H—SiC Power MOSFET fabrication.

Figure 1:
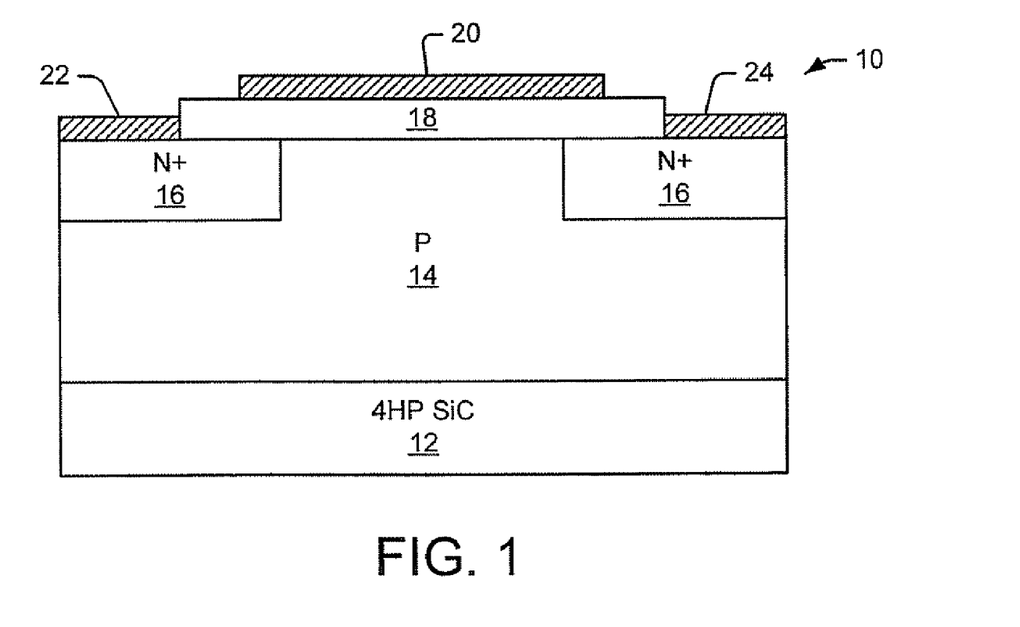
FIG. 1 is a cross sectional illustration of a lateral MOSFET according to some embodiments of the invention.

Referring now to FIG. 1, embodiments of a lateral MOSFET according to some embodiments of the invention are illustrated.

As illustrated in FIG. 1, an N-channel lateral MOSFET 10 includes a p-type epitaxial layer 14 grown on a substrate 12, which may be an 8° off-axis (0001) conducting 4HP SiC crystal. Other polytypes and/or off-axis angles of silicon carbide may also be used for the substrate 12. In some embodiments, the epitaxial layer 14 may have a thickness of about 5 µm or more and may be formed using, for example, an MOCVD process, and may be doped with p-type impurities such as boron and/or aluminum at a concentration of about $5 \times 10^{15}$-$1 \times 10^{16}$ cm$^{-3}$. The epitaxial layer 14 may have a thickness less than 5 µm in some cases. In particular embodiments, the epitaxial layer 14 may have a thickness of about 5 µm and may have a dopant concentration of about $5 \times 10^{15}$ cm$^{-3}$. In some embodiments, the channel region of the epitaxial layer 14 may be doped via ion implantation and may have a dopant concentration of about $1 \times 10^{16}$ cm$^{-3}$ to $1 \times 10^{19}$ cm$^{-3}$.

Nitrogen and/or phosphorus ions may be implanted into the epitaxial layer 14 to form n+ source/drain regions 16, such that the n+ source/drain regions have a dopant concentration of about $1 \times 10^{19}$ cm$^{-3}$ or more. However, if the dopant concentration of the source/drain regions 16 is less than $1 \times 10^{20}$, a thermal anneal may be required to form ohmic contacts thereon. In particular embodiments, the n+ source/drain regions 16 are doped with phosphorus at a dopant concentration of about $1 \times 10^{20}$ cm$^{-3}$. The implants may be activated, for example by a 1650° C. Ar anneal in the presence of Si overpressure. A 0.5 µm thick deposited oxide layer may serve as a field oxide (not shown). A control oxide (i.e. gate oxide) layer 18 is formed on the epitaxial layer 14 between and extending onto the source/drain regions 16. The thickness of the control oxide layer 18 may depend on the desired operating parameters of the device. For example, it may be appropriate to select an oxide thickness based on a maximum electric field of 3 MV/cm. In particular, the control oxide layer 18 may have a thickness of about 500 Å, which corresponds to a maximum gate voltage of 15V.

The control oxide layer 18 may be grown, for example, using a multi-stage oxidation process including an oxidation step in dry $O_2$ followed by re-oxidation (ReOx) in wet $O_2$ as described, for example, in U.S. Pat. No. 5,972,801, the disclosure of which is incorporated herein by reference in its entirety.

For example, the control oxide layer 18 may be grown by a dry-wet oxidation process that includes a growth of bulk oxide in dry $O_2$ followed by an anneal of the bulk oxide in wet $O_2$. As used herein, anneal of oxide in wet $O_2$ refers to an anneal of an oxide in an ambient containing both $O_2$ and vaporized $H_2O$. An additional anneal in an inert atmosphere may be performed between the dry oxide growth and the wet oxide anneal. The dry $O_2$ oxide growth may be performed, for example, in a quartz tube at a temperature of up to about 1200° C. in dry $O_2$ for a time of at least about 2.5 hours. Dry oxide growth is performed to grow the bulk oxide layer to a desired thickness. The temperature of the dry oxide growth may affect the oxide growth rate. For example, higher process temperatures may produce higher oxide growth rates. The maximum growth temperature may be dependent on the system used.

In some embodiments, the dry $O_2$ oxide growth may be performed at a temperature of about 1200° C. in dry $O_2$ for about 2.5 hours. The resulting oxide layer may be annealed at a temperature of up to about 1200° C. in an inert atmosphere. In particular, the resulting oxide layer may be annealed at a temperature of about 1175° C. in Ar for about 1 hour. The wet $O_2$ oxide anneal (ReOx) may be performed at a temperature of about 950° C. or less for a time of at least about 1 hour. The temperature of the wet $O_2$ anneal may be limited to discourage further thermal oxide growth at the SiC/SiO$_2$ interface, which may introduce additional interface states. In particular, the wet $O_2$ anneal may be performed in wet $O_2$ at a temperature of about 950° C. for about 3 hours. The resulting control oxide layer 18 may have a thickness of about 500 Å.

A gate contact 20 is formed on the control oxide 18. The gate contact 20 may include, for example, boron-doped polysilicon and/or evaporated aluminum. Boron-doped polysilicon may be used to help adjust the threshold voltage of the device to a desired level. Polysilicon doped with other impurities, including n-type impurities, may also be used as a gate contact 20. In some embodiments, the thermal budget of the process may be a concern. In such cases, the use of evaporated aluminum may help reduce the thermal budget. Nickel source/drain contacts 22, 24 may be formed on the source/ drain regions 16. In particular, nickel contacts 22, 24 formed on the n+ source/drain regions 16 may exhibit ohmic behavior without any sintering.

Figure 2:
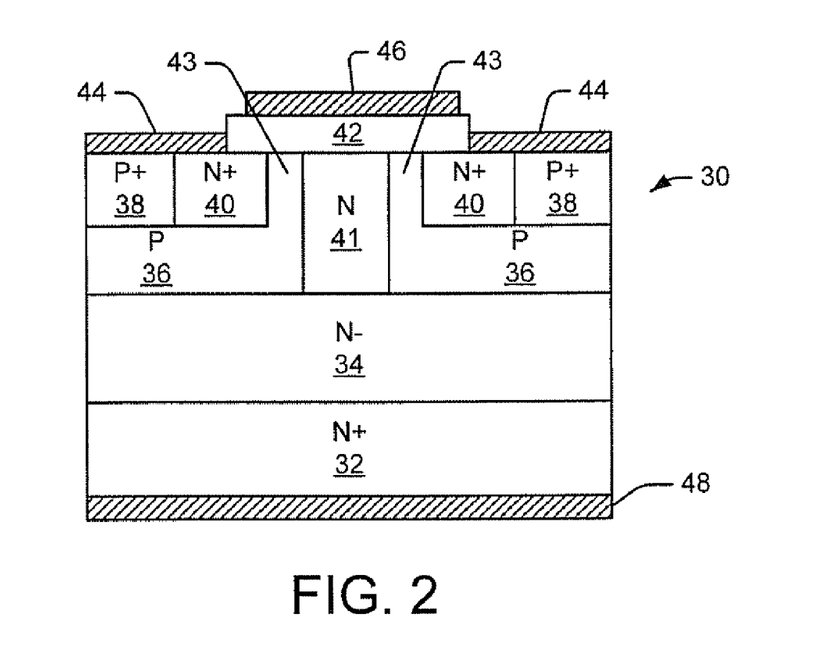
FIG. 2 is a cross sectional illustration of a vertical power MOSFET according to some embodiments of the invention.

Referring now to FIG. 2, a vertical power MOSFET 30 according to some embodiments of the invention is illustrated. Vertical silicon carbide MOSFETs are generally replicated in a unit cell. For ease of illustration, a single unit cell vertical MOSFET will be described.

As is seen in FIG. 2, a MOSFET 30 according to embodiments of the present invention may include an n+ monocrystalline silicon carbide substrate 32. An n− silicon carbide drift layer 34 is provided on a first face of the substrate 32. The doping and thickness of the drift layer 34 may be determined by taking into consideration the desired blocking voltage of the device. For example, for a high voltage device, the drift layer 34 may have a thickness of about 5 μm to about 100 μm and a doping concentration of about $8 \times 10^{15}$ to $1 \times 10^{16}$ cm$^{-3}$. First and second implanted p-type wells 36 are formed in the n− layer 34. The p-wells 36 may be formed using implanted aluminum, resulting in a dopant concentration of $1 \times 10^{17}$ to $1 \times 10^{19}$ cm$^{-3}$. In particular embodiments, the p-wells 36 may have a dopant concentration of about $1 \times 10^{18}$ cm$^{-3}$. Implanted contact regions 38 of p+ silicon carbide may also be provided in the p-wells 36. The implanted contact regions 38 may be formed, for example, by implantation of acceptor ions, such as boron and/or aluminum, to produce regions 38 having a dopant density of about $1 \times 10^{20}$ cm$^{-3}$. In particular, implanted aluminum may be more suitable for the contact regions 38 due to the lower diffusivity of aluminum in SiC.

First and second n+ source regions 40 are provided in the p-type wells 36 adjacent the contact regions 38. The implanted source regions 40 may be formed, for example, by implantation of donor ions to produce regions 40 having a dopant density of about $1 \times 10^{19}$ cm$^{-3}$ or more.

An n-type silicon carbide JFET region 41 is adjacent to the n+ source regions 40. The JFET region 41 is spaced apart from the source regions 40 by channel regions 43 in the p-type wells 36. The JFET region 41, which extends to the n− layer 34, may have a similar dopant concentration as the drift layer 34. In some embodiments, however, the JFET region 41 may be implanted with n-type impurities to have a higher dopant concentration than the drift layer 34. For example, the JFET region 41 may be implanted with donor ions to have a dopant density of from about $1 \times 10^{16}$ to about $1 \times 10^{17}$ cm$^{-3}$. The actual dopant concentration chosen may depend on the desired operational characteristics of the device.

A control oxide 42 of a suitable dielectric material, such as $SiO_2$, extends over the JFET region 41 and the channel regions 43 to the n+ source regions 40. The control oxide 42 may have a thickness of from about 500 to about 800 Å. In particular, the control oxide 42 may have a thickness of about 500 Å.

A gate contact 46 is provided on the control oxide 42 opposite the channel region 43. Source contacts 44 are formed on the n+ source regions 40. The source contacts 44 are also formed on the p+ contact regions 38 to short the n+ source regions to the p-well regions 36. The p-well regions 36 may be relatively highly doped to reduce and/or prevent turning on the parasitic npn transistors formed by source regions 40, well regions 36 and drift layer 34. For example, the p-well regions 36 may have a dopant concentration of about $1 \times 10^{15}$ cm$^{-3}$ to about $1 \times 10^{18}$ cm$^{-3}$ or greater. A drain contact 48 is provided on the face of the substrate 32 opposite the p-type wells 36. The drain contact 48 may be formed, for example, using nickel.

In some embodiments, the thermally grown control oxide 18 of the device 10 of FIG. 1 and/or the thermally grown control oxide 42 of the device 30 of FIG. 2 may be annealed in nitric oxide (NO) at a temperature above about 1175° C. In some embodiments, the control oxide 18, 42 may be annealed in NO at a temperature above about 1175° C. and below a temperature at which the oxide begins to physically decompose, which may be, for example, a temperature between about 1500° C. and about 1600° C. or above. In some embodiments, the control oxide 18, 42 may be annealed in NO at a temperature between about 1200° C. and about 1500° C. In particular, the control oxide 18, 42 may be annealed in NO at a temperature of about 1300° C. The anneal time may depend on the selected anneal temperature. For example, for a 1300° C. anneal, the anneal time may be about 2 hours.

In some embodiments, metallic impurities may be incorporated into the control oxide films 18, 42 by oxidizing the channel region of the devices 10, 30 in the presence of alumina as described, for example, in commonly assigned U.S. patent application Ser. No. 11/229,476, filed Sep. 16, 2005, entitled "Methods of Fabricating Oxide Layers on Silicon Carbide Layers Utilizing Atomic Oxygen", the disclosure of which is incorporated herein by reference in its entirety. In particular, alumina may be provided in the oxidation chamber by mounting alumina disks adjacent wafers being oxidized. In some embodiments, the only alumina present in the anneal system may be the alumina disks. By limiting the alumina in the system to the alumina disks, it may be possible to control and/or limit the oxidation rate.

In particular, an MEO oxidation may be performed by placing a 99.8% pure alumina disk in proximity with a SiC substrate being oxidized. One way to accomplish this is to mount an alumina disk parallel to and adjacent with a wafer in the anneal tube. Areas of the SiC substrate that are in proximity to the alumina disk may exhibit enhanced oxidation.

Vertical MOSFET structures may also be formed using epitaxial p-type layers as described in U.S. Pat. No. 6,653,659, the disclosure of which is incorporated herein by reference in its entirety.

Experimental Results

The following experimental results are provided as examples only and shall not be viewed as limiting the present invention. N-channel lateral MOSFETs were fabricated as test structures on 5 μm, $5 \times 10^{15}$ cm$^{-3}$ p-type epitaxial layers grown on 8° off-axis (0001) conducting 4HP substrates. Phosphorus was implanted to form the source/drain regions and a heavy aluminum dose ($1 \times 10^{18}$ cm$^{-3}$ box profile) was implanted to simulate the DMOSFET p-well region for half of the devices (i.e. the implanted channel devices). The implants were activated by annealing at 1650° C. in Ar with Si overpressure for about 5 minutes to about 1 hour. A sacrificial oxidation may be performed after the implants are activated in order to improve the surface of the epitaxial layer. Furthermore, a field oxide may be grown and patterned to expose the active region of the device. Growth of the field oxide may also incorporate a sacrificial thermal oxidation over the active region of the device.

A 0.5 μm thick oxide layer was then deposited and patterned as the field oxide. In some wafers (referred to herein as the ReOx wafers), a 500 Å thick control oxide was grown at 1200° C. in dry $O_2$ followed by a 950° C. wet reoxidation (ReOx). Some wafers (the MEO wafers) were thermally oxidized in the presence of metallic impurities to form a control oxide having a thickness $t_{ox}$ of about 600 Å to about 900 Å. In some wafers (referred to herein as the NO wafers), the control oxide was grown using the reoxidation process described above and subsequently annealed in-situ in NO at 1300° C. in a silicon carbide tube coated with a coating of high quality silicon carbide deposited by chemical vapor deposition.

To form the MEO wafers, a plurality of SiC wafers to be oxidized were placed in SiC boats on a SiC paddle. A 99.8% pure alumina disk was mounted upright between each of the boats, parallel to the disks in the boats. The paddle including the boats, SiC wafers and alumina disks, was inserted into a SiC anneal tube with a loading temperature of 800° C. under a flow of $N_2$ and $O_2$. The temperature within the anneal tube was ramped up to 1000° C., and the SiC wafers were oxidized for about 6.5 hours. The SiC wafers were then annealed in $N_2$ for about 5.5 hours at 1000° C. and then the anneal tube was cooled down for two hours.

Boron doped polysilicon was deposited to form the gate electrode for the ReOx and NO wafers, while evaporated aluminum was used for the MEO wafers to reduce or minimize the thermal budget. Nickel contacts were formed on the source/drain regions by evaporation and lift-off. In the MEO wafers, the contacts were annealed at about 500° C. to make the contacts ohmic. The anneal of MEO wafers was limited to 500° C. to protect the aluminum gate. For the NO wafers, the contacts may be annealed at higher temperatures (e.g. about 825° C.). Companion n-type wafers were also oxidized and metallized to create NMOS-capacitors for comparison purposes. Lateral MOSFETs were formed with a 400 μm×400 μm channel dimension to make the channel resistance dominant for ease of field effect mobility extraction and capacitance-voltage (C-V) measurements.

Measurement of the field effect mobility of the devices was accomplished by grounding the source contact and the backside of the wafers, and applying a fixed voltage of 50 mV to the drain contact. The gate voltage was swept to obtain an $I_{ds}$-$V_G$ curve. Mobility values were then calculated from the extracted data.

Figure 3A:
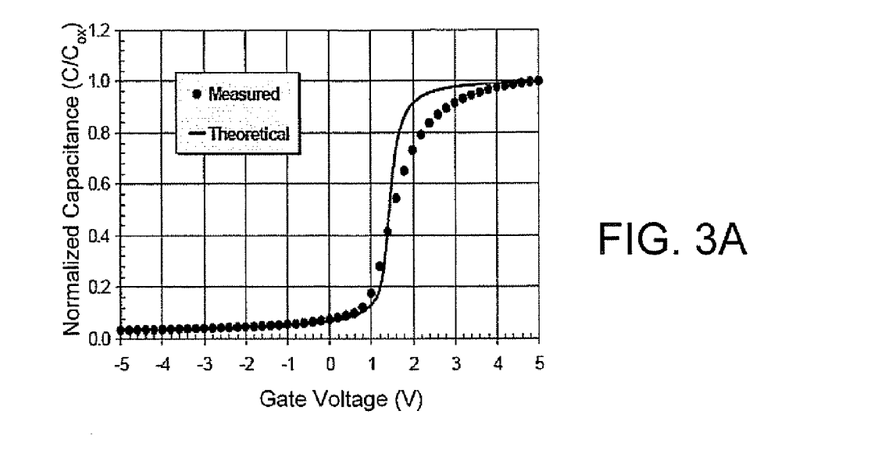
FIG. 3A is a graph of measured and theoretical values of capacitance versus voltage for MOSFET devices formed in accordance with conventional techniques.
Figure 3B:
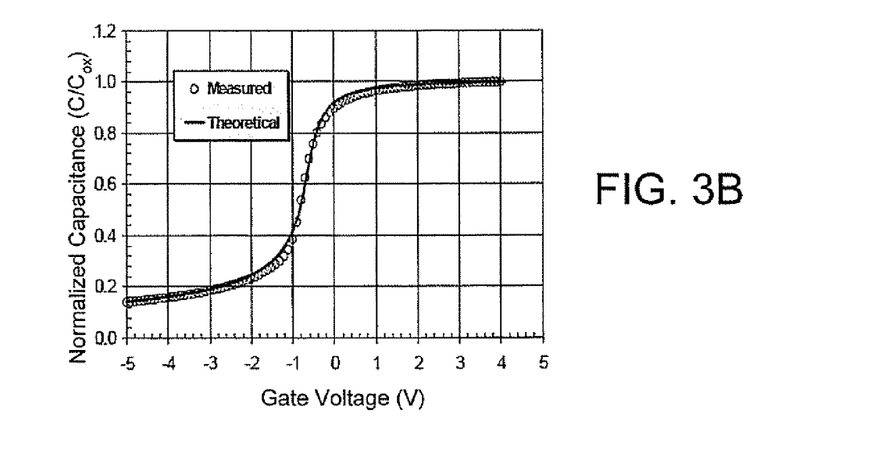
FIGS. 3B-3C are graphs of measured and theoretical values of capacitance versus voltage for MOSFET devices formed in accordance with some embodiments of the invention.
Figure 3C:
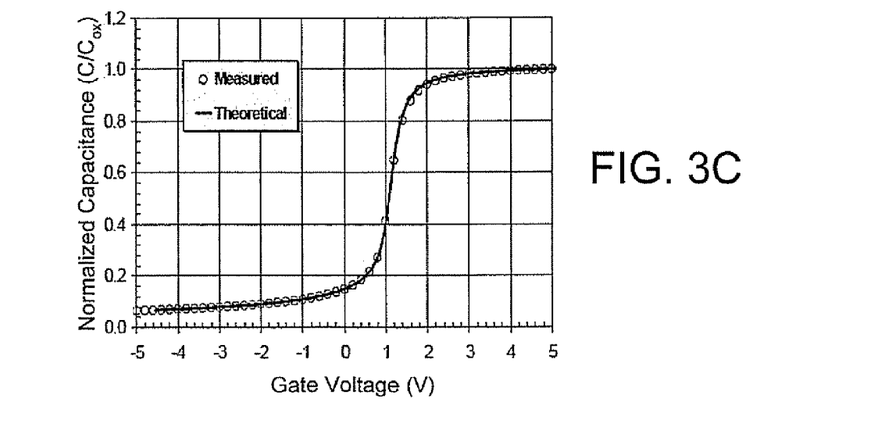

FIGS. 3A-3C show the measured NMOS C-V plotted against the theoretical C-V curve for the ReOx, NO and MEO wafers, respectively. The ideal C-V was formulated to take into account the metal-semiconductor work function difference ($\phi_{MS}$) and the effective fixed charge density ($Q_F$). The ReOx and MEO samples had negative $Q_F$ of $-1.6 \times 10^{12}$ cm$^{-2}$ and $-6.5 \times 10^{11}$ cm$^{-2}$, respectively, which may indicate a high density of negatively charged midgap states that do not change occupancy during the measurement sweep. The NO sample, on the other hand, had a positive $Q_F$ of $8.3 \times 10^{11}$ cm$^{-2}$. As illustrated in FIG. 3A, the ReOx sample also showed significant stretch-out from flatband to accumulation due to interface trapping near $E_C$. The NO sample (FIG. 3B) showed marked improvement with only a slight stretch-out, while the C-V curve of the MEO sample (FIG. 3C) was practically coincident with the theoretical curve.

Figure 4:
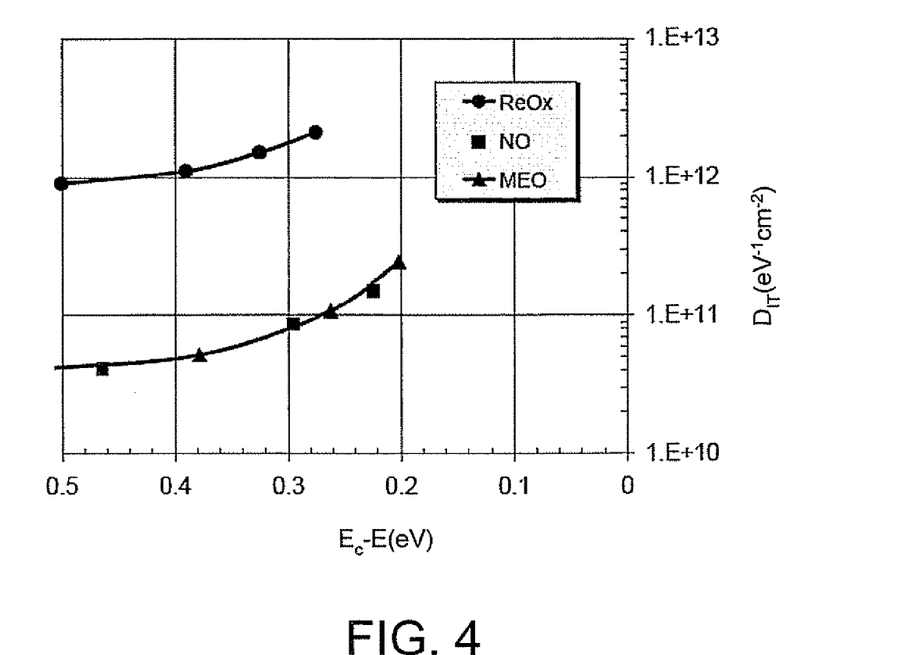
FIG. 4 is a graph of interface state density ($D_{IT}$) versus energy level from the conduction band for MOSFET devices formed in accordance with some embodiments of the invention as well as MOSFET devices formed in accordance with some conventional techniques.

FIG. 4 is a graph of interface state density ($D_{IT}$) versus energy level from the conduction band for MEO, NO and ReOx MOSFET devices. Room temperature AC conductance measurements shown in FIG. 4 reveal comparably low interface state densities ($D_{IT}$) for both NO and MEO wafers in the measurable energy range (up to 0.2 eV below $E_C$). This apparent contradiction between the C-V curve and the conductance results may be reconciled if the NO trap profile is increasing more rapidly than the MEO profile approaching the conduction band edge.

An increased oxidation rate was observed in the MEO process. However this effect may be controlled to produce an acceptable gate oxide thickness in the range of 600 to 900 Å. It is presently believed that the oxidation rate of MEO may be controlled/reduced by limiting/controlling the exposure of the wafers to alumina. For example, as described above, the alumina present during oxidation was limited to alumina disks disposed adjacent the SiC wafers being oxidized.

Figure 5:
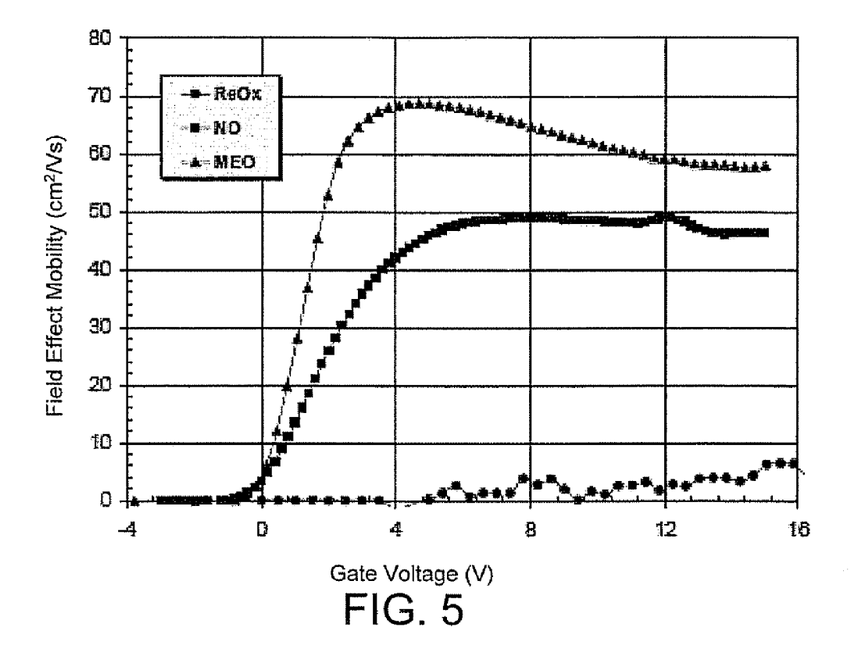
FIG. 5 is a graph of channel mobility versus gate voltage measured at room temperature for lateral MOSFET devices formed in accordance with some embodiments of the invention as well as MOSFET devices formed in accordance with conventional techniques.
Figure 6:
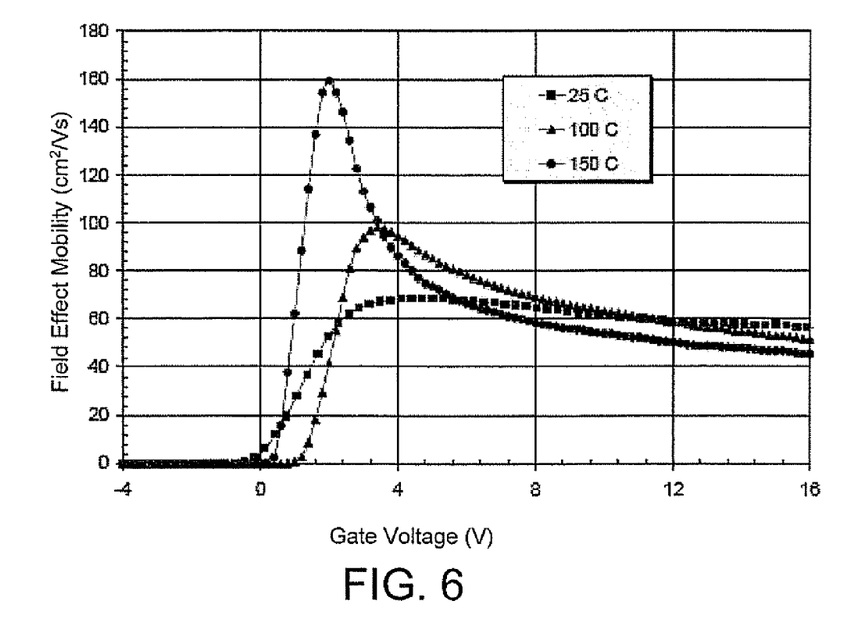
FIG. 6 is a graph of channel mobility versus gate voltage measured at various temperatures for lateral MOSFET devices formed in accordance with some embodiments of the invention.

FIG. 5 is a graph of channel mobility versus gate voltage measured at room temperature for epitaxial channel (i.e. lateral) MEO, NO and ReOx MOSFET devices. Both the MEO and NO MOSFETs showed improved turn-on characteristics with peak $\mu_{CH}$ of 69 and 49 cm$^2$/Vs, respectively. The peak channel mobility $\mu_{CH}$ for the MEO was roughly 50% of the value reported in H. Olafsson, Ph.D. Dissertation, Chalmers University (2004). However, as illustrated in FIG. 6, which is a graph of channel mobility versus gate voltage measured at various temperatures for lateral MEO MOSFET devices, the low field mobility for MEO devices increased to 160 cm$^2$/Vs at a measurement temperature of 150° C., in contrast to an irreversible 33% mobility reduction observed by Olafsson after thermal cycling. Re-measurement of the MEO MOSFET at room temperature (after the high temperature measurements illustrated in FIG. 6) showed a similar shape as the original room temperature curve, but shifted by a few volts, possibly due to mobile ion motion.

Figure 7:
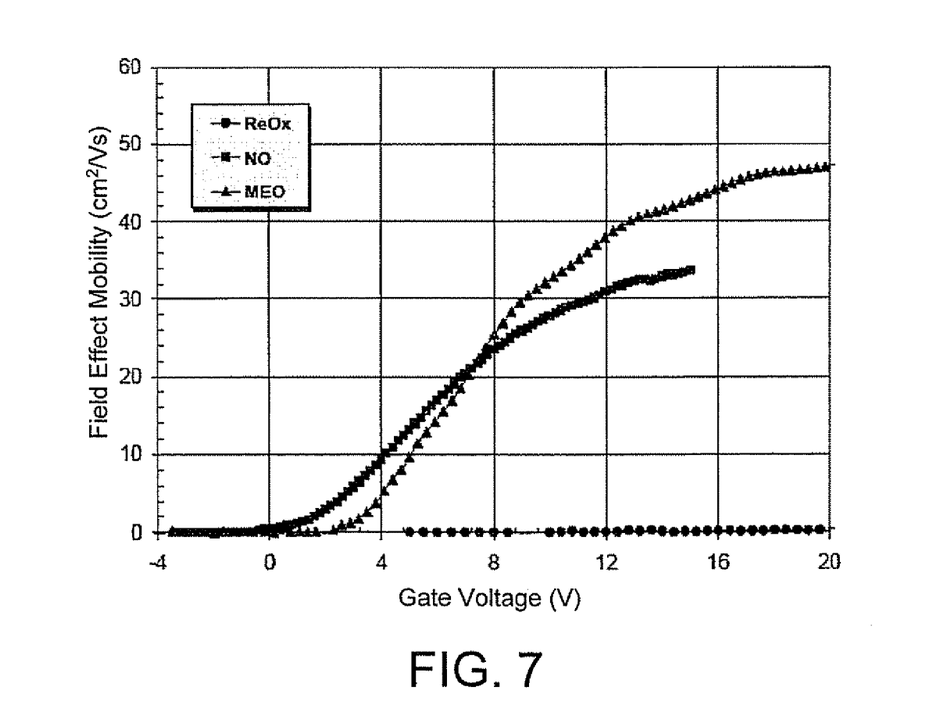
FIG. 7 is a graph of channel mobility versus gate voltage at room temperature for implanted-channel MOSFET devices formed in accordance with some embodiments of the invention as well as MOSFET devices formed in accordance with some conventional techniques.

The peak channel mobility $\mu_{CH}$ for the NO wafers represents a 67% increase over the value reported by Chung, above. As shown in FIG. 7, the turn-on characteristics were only slightly diminished on the implanted channel MOSFETs, with impressive peak channel mobilities $\mu_{CH}$ of 48 and 34 cm$^2$/Vs for MEO and NO, respectively, despite the $1 \times 10^{18}$ cm$^{-3}$ Al implant.

Olafsson also reported sensitivity of the MEO oxide to rapid thermal annealing (RTA). In order to form good power MOSFETs, it may be desirable to utilize an RTA to sinter the ohmic contacts for low resistance, electrical stability, and/or structural integrity. In the case of the MEO wafers, although the particular mechanism is not well understood, it is encouraging to note that the high quality MOS interface survived a high temperature RTA with little change in the MOSFET characteristics.

Figure 8:
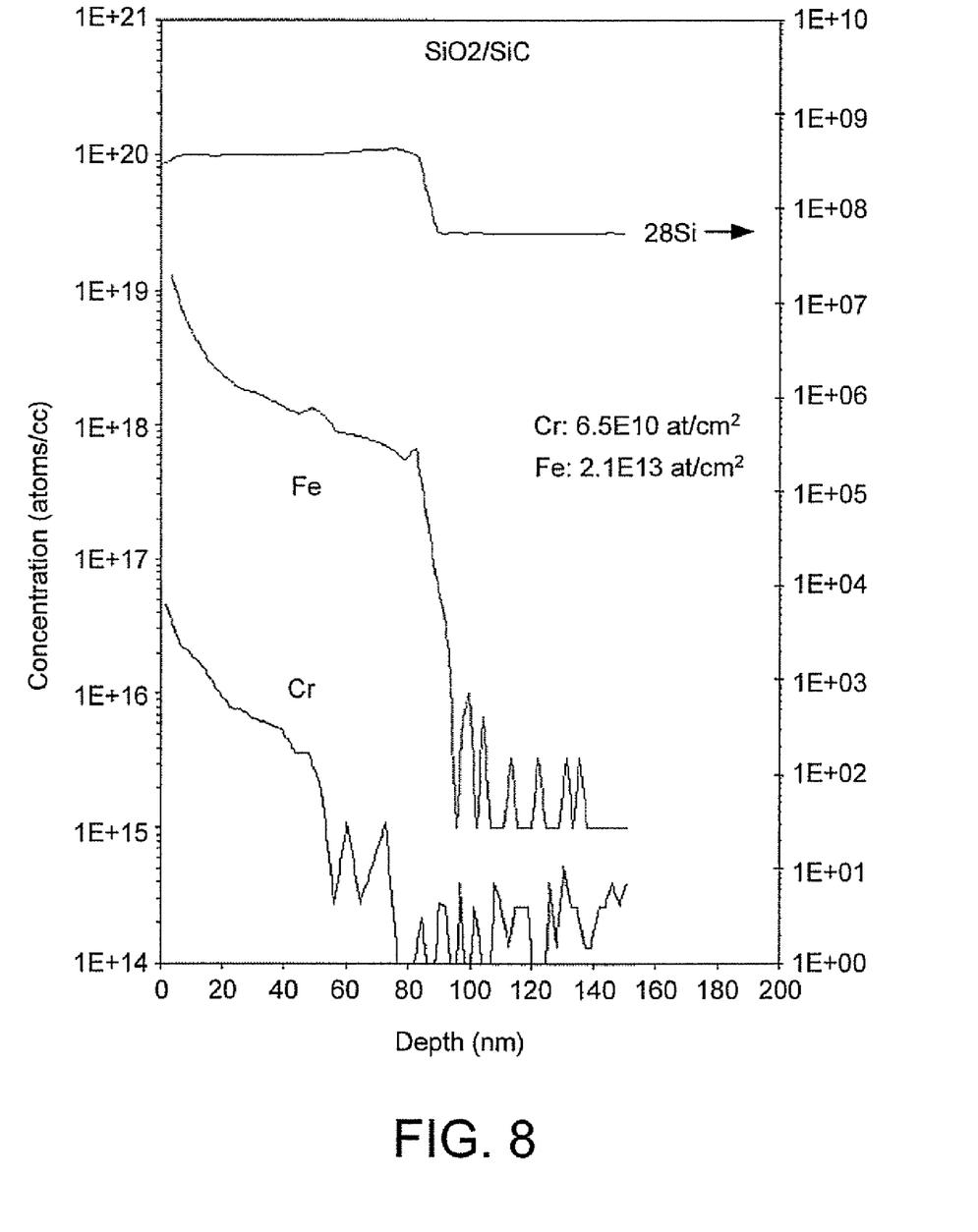
FIG. 8 is a plot of SIMS analysis of a MOS structure including an oxide formed according to some embodiments of the invention.

In light of the improved performance of the MEO MOSFET, an investigation of the MEO oxide was performed. SIMS analysis showed a nitrogen concentration of only $10^{18}$ cm$^{-3}$ uniformly distributed through the oxide. This value is close to the SIMS detection limit for nitrogen and is orders of magnitude less than the mid $10^{20}$ cm$^{-3}$ concentrations typically required for effective nitrogen passivation of the 4H—SiC MOS interface. Thus, it appears that nitridation may not be the source of mobility enhancement in the MEO wafers. The SIMS analysis results shown in FIG. 8 confirm the presence of metal impurities (Fe and Cr) in high concentrations as described in U.S. Pat. No. 6,559,068. It is noteworthy that iron was not only present in a high concentration, but that the high iron concentration extended all the way to the $SiO_2$/SiC interface.

According to embodiments of the invention, improved 4H—SiC MOS interfaces have been obtained using both NO and MEO-based processes. An NO anneal has been known to provide better results at higher temperatures. However, previous processes have been limited to 1175° C. due to temperature limitations of quartz furnace tubes. In some embodiments of the present invention, thermal oxidation and NO annealing in SiC tubes that are coated with SiC using chemical vapor deposition (CVD) may overcome limitations of conventional processing techniques to allow process temperatures of, for example, 1300° C. or more, which may provide substantial improvement over an 1175° C. NO anneal, with, in some cases, a 50% reduction in the $D_{IT}$ at 0.2 eV below $E_C$ and a 67% increase in the inversion channel mobility to 49 cm$^2$/Vs. According to some embodiments of the invention, the MEO process may result in even better performance with the peak channel mobility of 69 cm$^2$/Vs at room temperature increasing to 160 cm$^2$/Vs at 150° C. In MEO MOSFETs having $1\times10^{18}$ cm$^{-3}$ Al-implanted channels, the mobility remains a respectable 48 cm$^2$/Vs. However, in some variations of the MEO process, it may be desirable to remove unwanted contamination from the gate oxide that may provide mobile carriers at the SiO$_2$—SiC interface that may affect threshold voltages.

Implanted channel MOSFET devices formed according to embodiments of the invention (including annealing in NO at 1300° C.) and having a channel doping of $1\times10^{18}$ cm$^{-3}$ exhibited channel mobility $\mu_{ch}$ of 35 cm$^2$/Vs. The channel mobility of implanted channel devices is expected to be lower than that of epitaxial channel devices due to implant damage.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of forming a silicon carbide MOS structure, comprising:
    thermally growing an oxide layer on a layer of silicon carbide;
    placing the oxide layer on the silicon carbide layer in a silicon carbide tube, wherein the silicon carbide tube comprises a tube of silicon carbide having a silicon carbide coating thereon;
    annealing the oxide layer in the silicon carbide tube in an environment containing NO at a temperature greater than 1175° C.; and
    forming a gate electrode on the oxide layer, wherein the gate electrode comprises polysilicon and/or a metal.

2. The method of claim 1, wherein annealing the oxide layer comprises annealing the oxide layer in an environment containing NO at a temperature between about 1200° C. and about 1600° C.

3. The method of claim 1, wherein annealing the oxide layer comprises annealing the oxide layer in an environment containing NO at a temperature of about 1300° C.

4. The method of claim 3, wherein annealing the oxide layer comprises annealing the oxide layer for about 2 hours.

5. The method of claim 1, wherein the silicon carbide coating on the silicon carbide tube comprises a silicon carbide coating deposited by chemical vapor deposition on the silicon carbide tube.

6. The method of claim 1, wherein thermally growing the oxide comprises thermally growing the oxide in the presence of metallic impurities.

7. The method of claim 6, wherein thermally growing the oxide comprises thermally growing the oxide in the presence of alumina including the metallic impurities.

8. The method of claim 1, wherein thermally growing the oxide layer comprises thermally growing the oxide layer to a thickness of between about 500 Å and 900 Å.

9. The method of claim 1, wherein the silicon carbide layer comprises an epitaxial layer of 4H p-type silicon carbide having an off-axis orientation that is tilted at about 8° from a (0001) plane.

10. The method of claim 1, wherein thermally growing the oxide layer comprises:
    thermally growing a preliminary oxide layer on the silicon carbide layer in dry O$_2$ at a temperature of about 1200° C.; and
    re-oxidizing the preliminary oxide layer in wet O$_2$ at a temperature of about 950° C.

11. A method of forming a silicon carbide MOS structure, comprising:
    thermally growing an oxide layer on a layer of silicon carbide wherein the silicon carbide layer comprises a region of p-type silicon carbide;
    annealing the oxide layer in an environment containing NO at a temperature greater than 1175° C.; and
    forming a gate electrode on the oxide layer, wherein the gate electrode comprises polysilicon and/or a metal; and
    forming an n-type region in the p-type silicon carbide region;
    wherein thermally growing the oxide layer comprises thermally growing the oxide layer on the p-type silicon carbide region and at least partially on the n-type region;
    wherein the p-type silicon carbide region comprises a p-type epitaxial layer;
    wherein the n-type region comprises an n-type source region;
    wherein the method further comprises forming an n-type drain region in the p-type epitaxial layer that is spaced apart from the n-type source region and defines a channel region between the source region and the drain region; and
    wherein thermally growing the oxide layer comprises thermally growing the oxide layer on the channel region.

12. The method of claim 11, further comprising:
    forming ohmic contacts on the n-type source region and the n-type drain region; and
    annealing the ohmic contacts on the n-type source region and the n-type drain region at a temperature of at least about 500° C.;
    wherein the channel region has a channel mobility of at least about 40 cm$^2$/Vs at room temperature following the ohmic contact anneal.

13. A method of forming a silicon carbide MOS structure, comprising:
    thermally growing an oxide layer on a layer of silicon carbide wherein the silicon carbide layer comprises a region of p-type silicon carbide;
    annealing the oxide layer in an environment containing NO at a temperature greater than 1175° C.;
    forming a gate electrode on the oxide layer, wherein the gate electrode comprises polysilicon and/or a metal; and
    forming an n-type region in the p-type silicon carbide region;
    wherein thermally growing the oxide layer comprises thermally growing the oxide layer on the p-type silicon carbide region and at least partially on the n-type region;
    wherein the p-type silicon carbide region comprises an implanted p-type well region;
    wherein the n-type region comprises an n-type source region; and
    wherein the method further comprises forming the implanted p-type well region adjacent an n-type JFET region that extends from a surface of the structure to a drift region disposed beneath the p-type well region; and
    wherein thermally growing the oxide layer comprises thermally growing the oxide layer on a channel region extending in the p-type well region between the source region and the JFET region.

14. The method of claim 11, further comprising:
    forming an ohmic contact on the n-type source region; and
    annealing the ohmic contact on the n-type source region at a temperature of at least about 500° C.;
    wherein the channel region has a channel mobility of at least about 35 cm$^2$/Vs at room temperature following the ohmic contact anneal.

* * * * *